(12) United States Patent
Oshima et al.

(10) Patent No.: US 11,911,877 B2
(45) Date of Patent: Feb. 27, 2024

(54) ARTICLE INCLUDING INORGANIC COMPOUND AND METHOD OF MANUFACTURING ARTICLE INCLUDING INORGANIC COMPOUND

(71) Applicant: CANON KABUSHIKI KAISHA, Tokyo (JP)

(72) Inventors: Kanako Oshima, Tokyo (JP); Nobuhiro Yasui, Yokohama (JP); Hiroshi Saito, Kawasaki (JP); Yoshihiro Ohashi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 287 days.

(21) Appl. No.: 16/802,791

(22) Filed: Feb. 27, 2020

(65) Prior Publication Data

US 2020/0282526 A1 Sep. 10, 2020

(30) Foreign Application Priority Data

Mar. 8, 2019 (JP) ................................. 2019-042824
Feb. 14, 2020 (JP) ................................. 2020-023498

(51) Int. Cl.
| | |
|---|---|
| *C04B 35/00* | (2006.01) |
| *B25B 11/00* | (2006.01) |
| *B33Y 10/00* | (2015.01) |
| *B28B 1/00* | (2006.01) |
| *B33Y 80/00* | (2015.01) |
| *B33Y 70/00* | (2020.01) |
| *C04B 38/00* | (2006.01) |
| *H01L 21/683* | (2006.01) |
| *C04B 35/101* | (2006.01) |
| *C04B 35/106* | (2006.01) |
| *H01L 21/687* | (2006.01) |

(Continued)

(52) U.S. Cl.
CPC ............ *B25B 11/005* (2013.01); *B28B 1/001* (2013.01); *B33Y 10/00* (2014.12); *B33Y 70/00* (2014.12); *B33Y 80/00* (2014.12); *C04B 35/106* (2013.01); *C04B 35/1015* (2013.01); *C04B 38/00* (2013.01); *C04B 38/0074* (2013.01); *H01L 21/6838* (2013.01); *H01L 21/68785* (2013.01); *B01L 9/52* (2013.01); *C04B 2235/3224* (2013.01); *C04B 2235/616* (2013.01); *H01L 21/67* (2013.01); *H01L 21/683* (2013.01); *H01L 21/687* (2013.01); *H01L 21/68714* (2013.01)

(58) Field of Classification Search
CPC ... B25B 11/005; B28B 1/001; C04B 35/1015; C04B 35/106; C04B 38/00; C04B 38/0074; C04B 2235/3224; C04B 2235/616
See application file for complete search history.

(56) References Cited

U.S. PATENT DOCUMENTS

2003/0203184 A1* 10/2003 Sunderrajan ............... B32B 5/18
428/319.3
2016/0276198 A1* 9/2016 Anada .................. H01L 21/6833

FOREIGN PATENT DOCUMENTS

| JP | 1-502890 A | 10/1989 |
|---|---|---|
| JP | 2010-205789 A | 9/2010 |
| WO | 88/02677 A2 | 4/1988 |

* cited by examiner

*Primary Examiner* — Monica A Huson
*Assistant Examiner* — Kelsey C Grace
(74) *Attorney, Agent, or Firm* — Venable LLP

(57) ABSTRACT

An article including an inorganic compound according to the present invention includes a porous part and a no-porous frame body surrounding the porous part in a plane direction, and includes a stress relaxation part between the porous part and the frame body.

18 Claims, 7 Drawing Sheets

(51) Int. Cl.
*H01L 21/67* (2006.01)
*B01L 9/00* (2006.01)

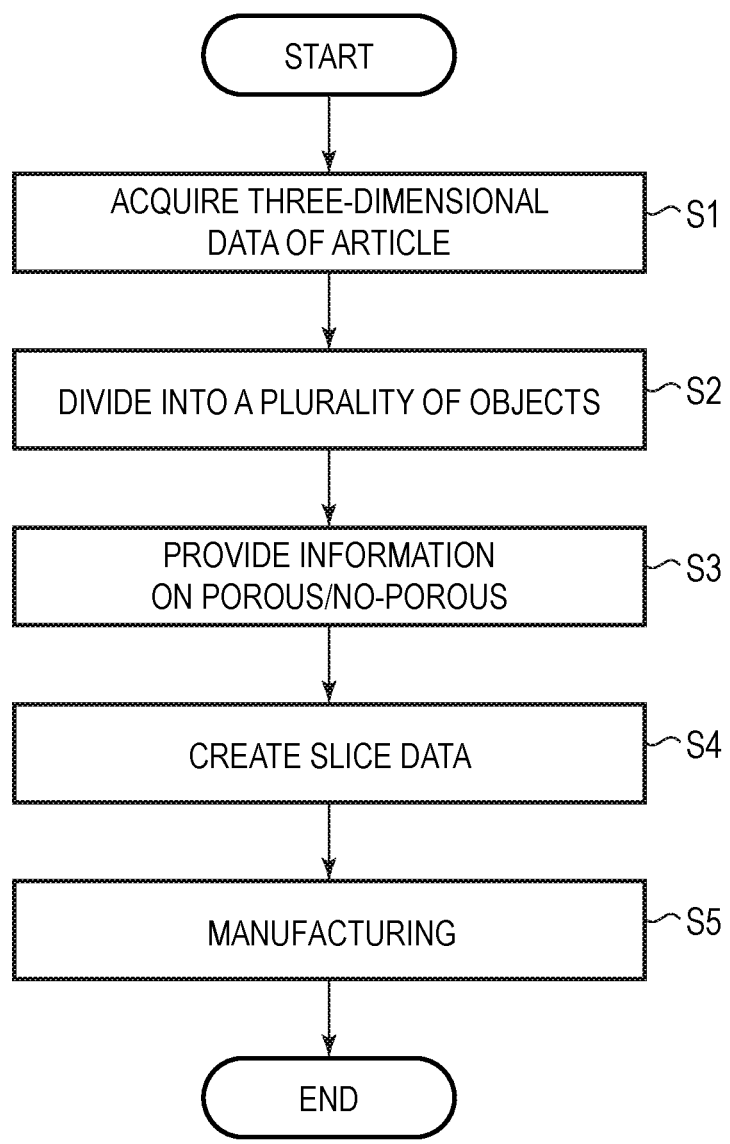

ARTICLE INCLUDING INORGANIC COMPOUND AND METHOD OF MANUFACTURING ARTICLE INCLUDING INORGANIC COMPOUND

BACKGROUND OF THE INVENTION

Field of the Invention

The present invention relates to an article including an inorganic compound and a method of manufacturing an article including an inorganic compound by using an additive manufacturing technique of a direct manufacturing method.

Description of the Related Art

Ceramic (inorganic compound) structures having both a porous structure and a no-porous structure are used for chuck plates used for transporting or fixing objects, filters for removing specific substances in fluids, and the like. Japanese Patent Application Laid-Open No. 2010-205789 discloses, as a jig for fixing a semiconductor wafer used in a semiconductor manufacturing apparatus or the like, a vacuum chuck member provided with a mounting part for mounting a semiconductor wafer in a concave part of a support part including a ceramic material having a no-porous structure. The mounting part includes a ceramic material having a porous structure, and can suck and fix the semiconductor wafer onto the mount part by sucking air through a suction port and the mount part provided to the support part.

Conventionally, such a vacuum chuck member has been formed by bonding a support part including a ceramic body having a no-porous structure and a mounting part including a ceramic material having a porous structure prepared in advance to each other with a glass paste.

However, the strength of an adhesive layer is relatively weak, which has caused a problem that a ceramic material having a porous structure is exfoliated from the adhesive layer formed of a glass paste under some use conditions. Furthermore, since the adhesive layer is formed by melting solid glass, it has been difficult to control the thickness of the adhesive layer.

In recent years, in applications for prototypes to be manufactured in a short time or for a small number of parts to be manufactured, an additive manufacturing technique for bonding material powders with an energy beam to obtain a manufactured object having a desired shape has become widespread for resin materials and metal materials, and thus application to manufacturing of ceramic parts has been studied.

Japanese Patent Application Laid-Open No. H01-502890 describes a method for manufacturing an article by using a so-called powder bed fusion method. According to this method, a powder layer including material powder is formed on a base plate, and a part of the powder layer which corresponds to the article is selectively irradiated with an energy beam to repeat a series of steps of sintering the powder. During the repetition of the series of these steps, a previously sintered part and a subsequently sintered part are bonded to each other to obtain an article having a desired shape.

A direct manufacturing method such as a powder bed fusion method requires neither use of a mold nor shaving from an ingot, and can directly mold an article from powder, so that a manufactured object can be obtained accurately in a short time. In addition, since manufacturing can be performed based on three-dimensional data created by using a design tool such as 3D CAD (three-dimensional computer-aided design) software, this method has an advantage that design change is easy and a three-dimensional manufactured object having a complicated and fine shape can be manufactured.

Now consider the case where a ceramic manufactured object including a porous structure part (porous part) and a no-porous structure part (no-porous part) described in Japanese Patent Application Laid-Open No. 2010-205789 which are integrated with each other is manufactured by the direct manufacturing method described in Japanese Patent Application Laid-Open No. H01-502890. When the direct manufacturing method is applied to a ceramic material having lower ductility than a metal material, countless cracks are formed inside the manufactured object due to the stress generated when the material powder melts and solidifies. Therefore, in order to obtain a high-strength manufactured object, after performing molding with an energy beam, a post-processing step is performed to reduce cracks in the manufactured object.

A heat treatment may be performed as the post-processing step. However, in the case of the ceramic manufactured object in which the porous structure and the no-porous structure are integrated with each other, there is a large difference in thermal behavior between the porous part and the no-porous part. Due to this difference in thermal behavior, a large stress occurs at the boundary between the porous structure part and the no-porous structure part during the heat treatment, which causes a problem that the porous structure part and a boundary part which have low mechanical strength are broken.

An object of the present invention, which has been made to address such a problem, is to provide a method of using an additive manufacturing technique of a direct manufacturing method to manufacture an article including a high-strength inorganic compound in which a porous structure and a no-porous structure are integrated with each other.

SUMMARY OF THE INVENTION

An article including an inorganic compound according to an aspect of the present invention includes a porous part, a nonporous frame body surrounding the porous part, and a stress relaxation part between the porous part and the frame body, the porous part and the frame boding being arranged in an in-plane direction.

A method of manufacturing an article including an inorganic compound according to another aspect of the present invention is a method of manufacturing an article including a porous part and a no-porous frame body surrounding the porous part, and further including a stress relaxation part between the porous part and the frame body includes: forming a powder layer with powder containing inorganic compound powder, and irradiating the powder layer with an energy beam based on a three-dimensional shape of the article to melt and solidify or sinter the powder.

According to this invention, an article including an inorganic compound in which a porous structure and a no-porous structure are integrated with each other can be obtained by using an additive manufacturing technique of a direct manufacturing system.

Further features of the present invention will become apparent from the following description of exemplary embodiments with reference to the attached drawings.

BRIEF DESCRIPTION OF THE DRAWINGS

FIG. 1 is a flowchart illustrating a flow of steps in an example of an article manufacturing method according to the present invention.

DESCRIPTION OF THE EMBODIMENTS

Preferred embodiments of the present invention will now be described in detail in accordance with the accompanying drawings.

(Additive Manufacturing Apparatus)

Figure 6:
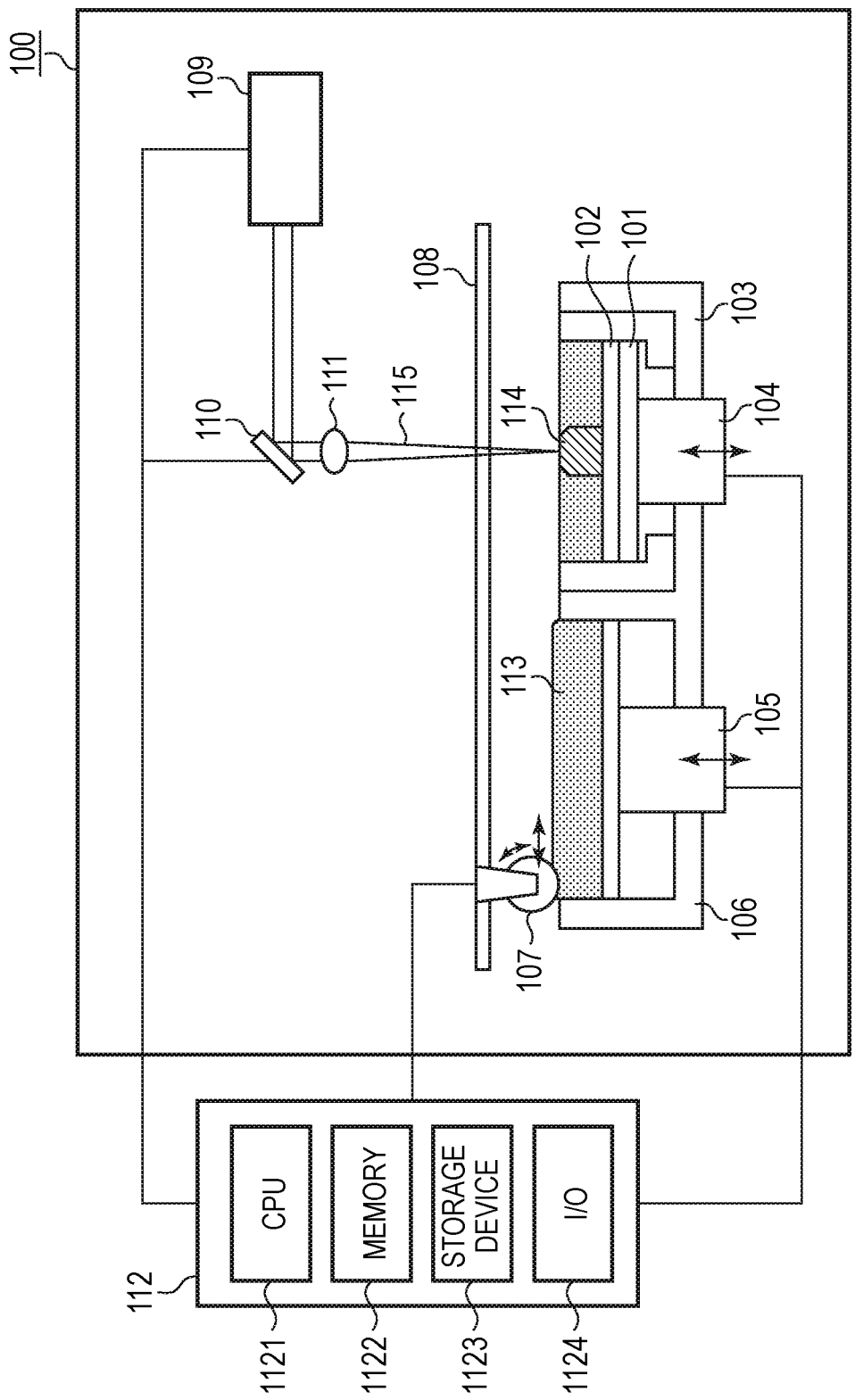
FIG. 6 is a schematic configuration diagram illustrating a configuration of an additive manufacturing apparatus.

First, an additive manufacturing apparatus 100 used in the present embodiment will be described with reference to FIG. 6. FIG. 6 is a schematic configuration diagram illustrating a configuration of the additive manufacturing apparatus 100.

As illustrated in FIG. 6, the additive manufacturing apparatus 100 includes a table 101, a plate 102, a container 103, vertical movement mechanisms 104 and 105, a powder supply container 106, a roller 107, a movement guide 108, a laser light source 109, a scanner 110, a condenser lens 111 and a controller 112.

The table 101 is a table for mounting the plate 102 thereon, and also serves as a bottom surface of a container 103. The table 101 has pins (not illustrated), and the plate 102 is positioned by fitting the pins into pin holes (not illustrated) of the plate 102. The plate 102 can be fixed to the table 101 with screws. Note that the plate 102 is not necessarily required to be plate-shaped as long as the plate 102 functions as a support table when a manufactured object including an inorganic compound is formed. A method of positioning and fixing the plate 102 to the table is not limited to the above example. The table 101 is supported by the vertical movement mechanism 104 so as to be movable in a vertical direction. Here, in the present invention, the "manufactured object" indicates an object which has been produced by the additive manufacturing technique and left as it is, and an object obtained by subjecting the manufactured object to some processing such as a heat treatment as necessary is referred to as an article. However, when no processing is required for the manufactured object, the manufactured object and the article indicate the same thing.

The additive manufacturing apparatus 100 further includes a powder supply container 106 adjacent to the table 101, a roller 107, a movement guide 108 for moving the roller 107, a laser light source 109, a scanner 110, and a condenser lens 111. The powder supply container 106 is an apparatus for accommodating powder 113 for manufacturing and adjusting the supply amount of the powder 113 according to the thickness of a powder layer to be deposited on the container 103. The supply amount of the powder 113 can be adjusted by an upward movement amount of the vertical movement mechanism 105. The roller 107 is supported by the movement guide 108 so as to be movable in a horizontal direction. The roller 107 moves the powder from the powder supply container 106 to the container 103 to form a powder layer having a predetermined thickness while leveling the surface of the powder layer.

The laser light source 109, the scanner 110, and the condenser lens 111 constitute an irradiation optical system for locally and selectively irradiating a desired region 114 of the powder layer with a laser beam 115.

The controller 112 is a computer for controlling the operation of the additive manufacturing apparatus 100, and includes a CPU 1121, a memory 1122, a storage device 1123, an I/O port (input/output part) 1124, and the like.

The memory 1122 is a random access memory (RAM) or a read only memory (ROM). The storage device 1123 is a hard disk drive, a disk drive, a magnetic tape drive, or the like, and stores a program that implements processing of a flowchart described later.

The I/O port 1124 is connected to an external apparatus or a network, and, for example, can input and output data necessary for additive manufacturing from and to an external computer. The data necessary for the additive manufacturing includes shape data of a ceramic manufactured object to be manufactured, information of a material used for manufacturing, and shape data of each sintered layer, that is, slice data. The slice data may be received from an external computer, or may be created by the CPU 1121 in the controller 112 based on the shape data of a manufacturing model and stored in a memory.

The CPU 1121 expands a program stored in a storage device into the memory 1122 and executes the program to cause the additive manufacturing apparatus 100 to perform processing of each step described later.

The controller 112 is connected to respective parts such as the vertical movement mechanism 104, the vertical movement mechanism 105, the roller 107, the laser light source 109, the scanner 110, and the condenser lens 111, and controls the operations of these parts so as to cause these parts to execute processing related to manufacturing.

FIG. 1 is a flowchart illustrating the flow of steps in the method for manufacturing an article including an inorganic compound of the present invention. Hereinafter, an embodiment of the present invention will be described according to the flow of FIG. 1. However, the method for producing an article including an inorganic compound of the present invention is characterized in that a stress relaxation part for relaxing stress occurring between a porous part and a no-porous frame body surrounding the porous part. The other requirements are not limited to the following specific examples.

(Outline of Steps)

The present invention is a method for manufacturing an article including an inorganic compound in which a porous structure and a no-porous structure are integrated with each other.

An entire method of manufacturing an article including an inorganic compound will be described with reference to FIG. 1, and then characteristic portions of the present invention will be described. Each step of the method of manufacturing an article including an inorganic compound described below is implemented by expanding a program (data generation program) stored in the storage device 1123 into the memory 1122 and executing the program by the CPU 1121.

First, the CPU 1121 acquires three-dimensional shape data of an article (manufactured model) as a manufacturing target (step S1). The acquired three-dimensional shape data of the article is input from a 3D CAD or a three-dimensional scanner via the I/O port 1124 of the controller 112 and stored in the memory 1122.

Next, the CPU 1121 divides the three-dimensional shape data of the article into a plurality of objects (step S2), and gives information of porous structure/no-porous structure to each object (step S3). Alternatively, a plurality of objects to which information of porous structure/no-porous structure is given by 3D CAD or the like may be prepared in advance, and three-dimensional shape data may be formed by combining these objects.

Next, shape data of each layer which is required for layering and forming a manufactured object, that is, slice data of a three-dimensional manufactured object by the additive manufacturing apparatus 100 (step S4).

From step S1 to step S4, the CPU 1121 of the controller 112 may create data based on the manufactured model and the three-dimensional shape data and store the data in the RAM, or these steps may be executed by an external computer, and created data may be received through the I/O port 1124. Further, when one of three-dimensional shape data and slice data which has a stress relaxation part can be obtained, each step can be omitted.

Next, the plate 102 is positioned and fixed to the additive manufacturing apparatus 100. After the material powder is supplied on the plate to form a powder layer having a predetermined thickness, a solidified part is formed in the powder layer by radiating an energy beam according to the slice data and the material powder is melted/solidified or sintered. Formation of a powder layer and radiation of an energy beam are repeated for layering and manufacturing (step S5), thereby obtaining a manufactured object corresponding to a manufacturing model.

FIG. 2A to FIG. 2G are schematic cross-sectional views schematically illustrating a step S5 in a powder bed fusion bonding method which is an exemplary embodiment of the method of manufacturing an article including an inorganic compound of the present invention. A material powder 301 containing powder of an inorganic compound is used. First, a powder layer 302 including the material powder 301 and having a predetermined thickness is formed on the base plate 320 by using the roller 352 (see FIGS. 2A and 2B). Based on the slice data, the surface of the powder layer 302 is irradiated with an energy beam 501 emitted from an energy beam source 500 while scanning the energy beam 501, thereby selectively melting and solidifying or sintering the material powder (see FIG. 2C). At this time, regions to which the same energy beam irradiation condition is applied in the slice data can be melted and solidified or sintered on a continuous drawing line. For example, when the energy beam irradiation conditions for a frame body 304 and a stress relaxation part 306 are the same, a region corresponding to a porous part 305 can be first molded, and then the frame body 304 and the stress relaxation part 306 can be formed by a continuous drawing line, whereby a higher strength manufactured part 300 can be formed. Furthermore, the forming step can be advanced from a part having more pores in design. In other words, in the present invention, the forming step can be advanced from the porous part 305. For example, when the same irradiation condition is applied to the frame body 304 and the stress relaxation part 306, the powder in a region corresponding to the porous part 305 in the slice data is first bonded, and then a region corresponding to the frame body 304 and the stress relaxation part 306 is formed. As a result, the bonding between an end part of the porous part 305 and an adjacent part to the end part is strengthened, so that the manufactured part 300 having higher strength can be formed. In the figure, the stress relaxation part 306 is given reference numeral separately from the frame body 304, but the stress relaxation part 306 may be a part of the frame body 304.

Figure 5:
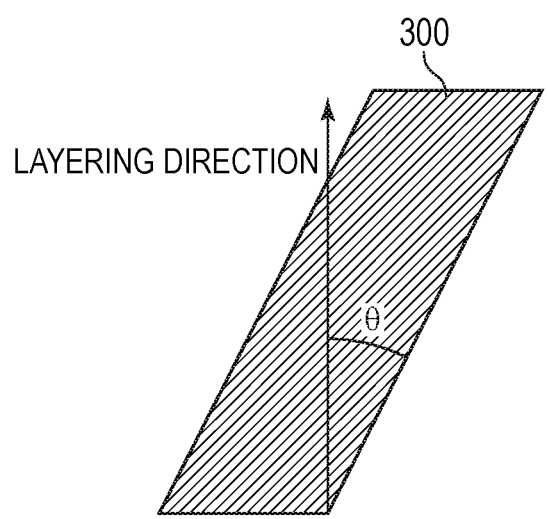
FIG. 5 is a schematic diagram schematically illustrating an overhang of a manufactured part.

Here, an overhang part will be described with reference to FIG. 5. When a manufactured part 300 having an overhang part at an angle θ with respect to a manufacturing direction (layering direction) is formed, an overhang part having an angle θ of 45° or less can be molded stably. When an overhang part having an angle θ larger than 45° exists, stable manufacturing can be performed by forming, for example, a columnar supporter (not illustrated) for supporting the overhang part. The supporter can be formed under such an energy beam irradiation condition that the supporter becomes porous or amorphous so that the supporter can be easily removed after formation of the manufactured object.

Through the above steps, a region (manufactured part) 300 where the material powder 301 has been melted and solidified or sintered, and a region (non-manufactured part) 303 which has been still in a powdery state are formed. Subsequently, the stage 351 is downward moved to a position which is lower than the upper end portion of the container 353 by the amount corresponding to one powder layer, and a new powder layer 302 is formed so as to cover the manufactured part 300 and the non-manufactured part 303 (see FIG. 2D). With respect to a step of forming the powder layer 302 and a step of selectively melting and solidifying or sintering the material powder by radiating the energy beam 501 while scanning the energy beam 501, a series of these steps is repeated once or plural times (see FIG. 2E), whereby a manufactured part in which manufactured parts formed from the respective powder layers are integrated with one another is formed in the stacked powder layers (see FIG. 2F).

Figure 2A:
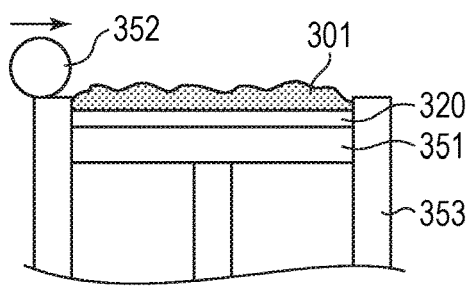
FIG. 2A is a schematic process diagram schematically illustrating an embodiment of the article manufacturing method the present invention.
Figure 2E:
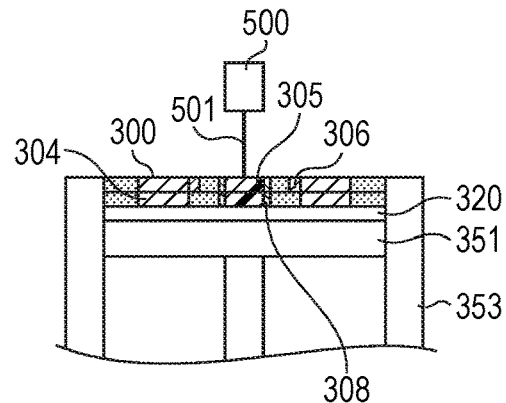
FIG. 2E is a schematic process diagram schematically illustrating the embodiment of the article manufacturing method of the present invention.
Figure 2B:
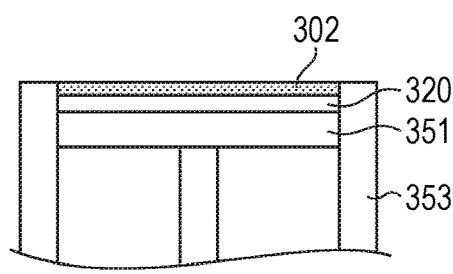
FIG. 2B is a schematic process diagram schematically illustrating the embodiment of the article manufacturing method of the present invention.
Figure 2F:
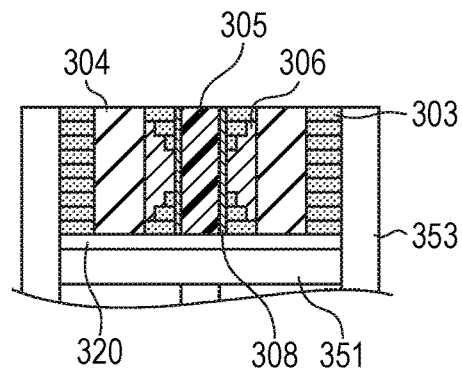
FIG. 2F is a schematic process diagram schematically illustrating the embodiment of the article manufacturing method of the present invention.
Figure 2C:
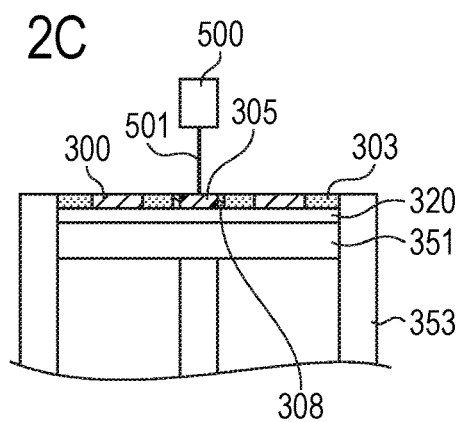
FIG. 2C is a schematic process diagram schematically illustrating the embodiment of the article manufacturing method of the present invention.
Figure 2G:
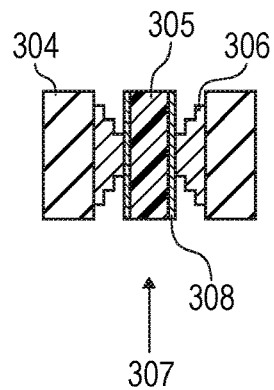
FIG. 2G is a schematic process diagram schematically illustrating the embodiment of the article manufacturing method of the present invention.

Next, the region (non-manufactured part) 303 which has been still in a powdery state and unbonded material powder involved in the porous part are removed, and post-processing such as separation from the base plate 320 or removal of the supporter is performed on the manufactured part as necessary, thereby obtaining a manufactured object 307 (see FIG. 2G). As described in detail later, in the figures, a fill pattern of the frame body 304 indicates a no-porous part, a fill pattern of the porous part 305 indicates a porous part, and a fill pattern of the stress relaxation part 306 indicates a stress relaxation part.

(Material Powder)

The material powder used in the present invention is inorganic compound powder. Here, the inorganic compound indicates a solid-state inorganic compound excluding metal, and a bonding state (crystalline or amorphous) of a solid does not matter. In the present specification, the inorganic compound indicates oxide, nitride, oxynitride, carbide or boride containing one or more elements of the element group including in addition to elements from Groups 1 to 14 except for hydrogen, antimony and bismuth. Examples of the inorganic compound powder usable as material powder include metal oxides, nonmetal oxides, nitrides, fluorides, borides, chlorides, and sulfides. The material powder may be made of one inorganic compound, or may be a mixture of two or more inorganic compounds. Furthermore, the inorganic compound powder means powder containing an inorganic compound as a main component, and does not exclude inclusion of components other than the inorganic compound.

The manufactured object containing an inorganic compound as a main component (hereinafter simply referred to as manufactured object) has higher mechanical strength than resins and metals.

The main component of the inorganic compound powder can be oxide. Since the oxide has fewer volatile components than other inorganic compounds, the oxide enables stable melting with an energy beam and is suitable for additive manufacturing based on the direct manufacturing method. Representative oxides include aluminum oxide, zirconium oxide, magnesium oxide, silicon oxide, and mixtures and compounds thereof.

Further, one of the powder containing aluminum oxide and zirconium oxide, and powder containing aluminum oxide and rare earth oxide can be used as the material powder of the additive manufacturing technique. These kinds of powder have lower melting points than powder including one inorganic compound, and thus can be melted even with a small output energy beam. If the material powder is insufficiently melted, a manufactured object cannot be formed. Therefore, the output of the energy beam has a lower limit value, but the lower limit value is reduced by using the foregoing powder, so that the selection range of the output value expands. As described later, the expansion of the selection range of the output value enables porous and no-porous parts to be easily formed selectively and separately from each other. In addition, since manufacturing can be performed with a small output, adhesion and bonding of unnecessary material powder due to heat transfer from an energy beam irradiation unit is suppressed, and thus manufacturing accuracy is improved.

From the viewpoint of enhancement of the strength of the manufactured object, powder in which a phase separation structure is formed by melting and solidification can be used. For example, a mixture having a eutectic composition of aluminum oxide and zirconium oxide, a mixture of aluminum oxide and a rare earth oxide, or the like can be used as the powder of the inorganic compound. By using these kinds of powder, a manufactured object having a phase separation structure having two or more phases can be obtained. The phase separation structure has an effect of suppressing extension of cracks, and additionally exerts a function of enhancing the mechanical strength of the manufactured object, etc. In the present invention, the eutectic composition refers to a range of composition±10% at the eutectic point.

When the energy beam is a laser beam, the material powder absorbs sufficient energy, and spread of heat in the powder layer is suppressed and thus localized, so that the influence of heat on the non-manufactured part is reduced. Therefore, the manufacturing accuracy is improved. For example, when an Nd:YAG laser is used, $Tb_4O_7$, $Pr_6O_{11}$, or the like that shows good energy absorption for the YAG laser may be added to the material powder. From the foregoing viewpoint, more preferable material powder is $Al_2O_3$—$ZrO_2$, $Al_2O_3$—$Gd_2O_3$, $Al_2O_3$—$Y_2O_3$, $Al_2O_3$—$Tb_4O_7$, $ZrO_2$—$Tb_4O_7$, $Y_2O_3$—$Tb_4O_7$, or $Gd_2O_3$—$Tb_4O_7$, and still more preferable material powder is $Al_2O_3$—$Gd_2O_3$—$Tb_4O_7$, $Al_2O_3$—$ZrO_2$—$Tb_4O_7$, $Al_2O_3$—$Y_2O_3$—$Tb_4O_7$ or the like.

Note that in the present invention, the inorganic powder may contain a small amount of organic materials such as resins and inorganic materials such as metals (10 parts by weight or less per 100 parts by weight of the inorganic compound powder) in addition to the inorganic compound in order to adjust the fluidity of the powder and the performance of the final manufactured object.

(Formation of Powder Layer)

An example of an exemplary embodiment of the step of forming the powder layer in the present invention will be described.

In the powder layer forming step, a powder layer is formed by using material powder containing inorganic compound powder. In a step of forming a first powder layer on the base plate 320, a powder layer 302 having a predetermined thickness is formed as illustrated in FIG. 2B. In a step of forming a second and subsequent powder layers, a new powder layer 302 is formed on a powder layer (non-manufactured part 303) and a solidified part (manufactured part) 300 which have been formed in a preceding step (see FIG. 2D). The method of forming the powder layer 302 is not particularly limited. The powder layer 302 may be formed while specifying the layer thickness with a roller 352, a blade, or the like as illustrated in FIG. 2A.

The powder bed fusion method has been described above, but the manufacturing method according to the present invention is not limited to the foregoing method, and a directional energy deposition (so-called cladding method) can also be used. The directional energy deposition is a method that does not form any powder layer, but sprays and supplies material powder 301 from a nozzle to an irradiation position of an energy beam to be radiated based on slice data to build up the manufacturing material on a manufactured surface of one of the base plate 320 and the manufactured part 300.

(Melting and Solidification or Sintering of Material Powder)

A step of irradiating a powder layer with an energy beam based on slice data of a manufactured object to melt and solidify or sinter powder (hereinafter, abbreviated as a manufacturing step) in the present invention will be described based on an exemplary embodiment.

In the manufacturing step, the material powder is irradiated with an energy beam according to the slice data to be melted and solidified or sintered.

When the powder layer is irradiated with an energy beam having a sufficient calorific value, the material powder absorbs energy, and the energy is converted into heat to melt the material powder. When the radiation of the energy beam is completed, the molten material powder is cooled and solidified by a peripheral portion adjacent to a molten part. A region formed by melting and solidification becomes a no-porous body having few pores. However, micro-cracks formed by stress exist in the no-porous body.

On the other hand, when the amount of heat applied is reduced, sufficient amount of heat for melting the material powder is not obtained, and a phenomenon (called sintering) in which the surfaces of particles in the powder melt and the particles are bonded to one other occupies the majority. In the case of sintering, pores are likely to be formed around joints (necks) between the particles. In addition, if the amount of heat to be input is controlled to reduce the degree of sintering, unsintered particles that could not be bonded to surrounding particles are mixed in a laser irradiation part, and the unsintered particles are removed by subsequent washing, whereby a porous body having random pores can be formed.

By adjusting the scan pitch of the energy beam, the powder can be melted and solidified or sintered in a honeycomb-like shape. When the unsolidified/unsintered particles are removed by subsequent washing, a porous body having regular pores can be formed.

Here, spaces included in the manufactured object (inside of the outer shape) are collectively called voids, and voids formed by unsolidification/unsintering of the powder among the above voids are called pores. In other words, the voids include pores which are holes of a porous part and micro-cracks generated by stress during manufacturing. The porous part of the manufactured object includes pores which are designed and intentionally formed so that an article to be manufactured has a desired function, such as a chucking function to transport or fix an object, or a filtering function to remove specific substances in the fluid. Porosity can be evaluated by the following method. An SEM image of the surface of a polished manufactured object is acquired by a scanning electron microscope (SEM), the proportions of voids in the porous part, the frame body, and the stress relaxation part are calculated from the SEM image, and the area (%) of the voids per unit area is defined as porosity.

The porous structure of the present invention indicates a structure in which the porosity per unit area on a cross-section thereof (hereinafter simply referred to as porosity) is not less than 15%. From the viewpoint of improving the chucking function, the porosity of the porous part can be set to 18% or more. On the other hand, from the viewpoint that the porous part maintains the shape as a structure, the porosity is preferably 60% or less, more preferably 50% or less.

In the present invention, the no-porous structure indicates a structure in which the porosity per unit area on a cross-section thereof is not more than 10%. When high mechanical strength is required, the porosity of the no-porous structure is preferably small, and the porosity can be set to 5% or less.

As described later in detail, the stress relaxation part can be formed under the same energy beam irradiation condition as the frame body. In other words, the stress relaxation part can have a no-porous structure, and the porosity thereof can be set to 10% or less.

Figure 2D:
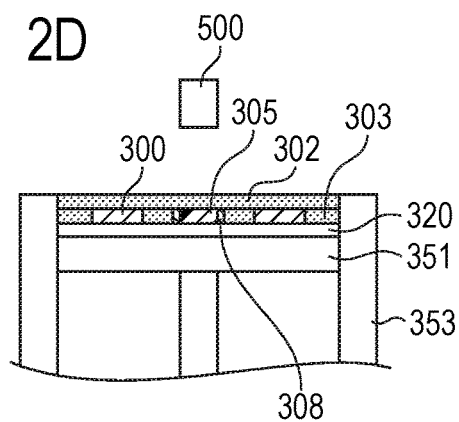
FIG. 2D is a schematic process diagram schematically illustrating the embodiment of the article manufacturing method of the present invention.

As illustrated in FIG. 2C, when the surface of the powder layer 302 formed on the base plate 320 is irradiated with the energy beam 501 while scanning the energy beam 501, the powder in the region irradiated with the energy beam 501 melts and solidifies or sinters to form the manufactured part 300. At this time, when the output of the energy beam 501 is adjusted so that heat applied to the manufacturing material reaches the interface between the base plate 320 and the powder layer 302, the base plate 320 and the manufactured part 300 are joined to each other. As illustrated in FIGS. 2D and 2E, when the powder layer 302 formed on the manufactured part 300 is irradiated with the energy beam 501, a new manufactured part 300 is formed. At this time, since heat applied to the manufacturing material reaches the interface between the previously formed manufactured part and the subsequently formed powder layer 302, the previously formed manufactured part and the newly formed manufactured part are joined to each other to form the manufactured part 300. A series of these melting and solidifying or sintering steps is repeated to form a manufactured object 307 in which manufactured parts each formed in each powder layer are joined and integrated with one another (see FIG. 2G).

A light source having a wavelength which is suitable in consideration of the absorption characteristics of the material powder is selected as an energy beam to be used. In order to perform high-precision manufacturing, a laser beam or an electron beam which can be narrowed in beam diameter and has high directivity can be adopted. When the material powder contains oxide powder, a YAG laser or fiber laser of a 1 μm wavelength band, or a $CO_2$ laser of a 10 μm wavelength band can be applied as a laser beam.

In the present invention, in the step of melting and solidification or sintering, when radiating an energy beam, at least one of the output, focal position, scan pitch and scan speed of an energy beam is switched according to an irradiation region, whereby a porous structure and a no-porous structure can be formed selectively and separately from each other. In other words, the slice data includes information indicating which region is formed to have a porous structure and which region is formed to have a no-porous structure.

When the energy beam is radiated, at least one of the output, scan pitch, and scan speed of the energy beam is switched according to the irradiation region, whereby the degrees of melting and sintering of the material can be changed and the porosity of the manufactured part can be changed. A porous structure can be formed by increasing the scan speed of the energy beam, increasing the scan pitch of the energy beam, or reducing the output of the energy beam with respect to the condition for forming a no-porous structure. Specifically, when the degree of melting is large, the manufactured part becomes a region having a small porosity, that is, has a no-porous structure. When the degree of melting is small and sintering is dominant, the manufactured part becomes a region having a large porosity, that is, has a porous structure. Furthermore, when the degree of melting is large and the scan pitch is sufficiently large, honeycomb-shaped pores are formed, and the manufactured part becomes a region having a large porosity, that is, has a porous structure.

When the output of the energy beam is set to be excessively low, the amount of heat may be insufficient and non-melted residue may occur. Conversely, when the output of the energy beam is set to be excessively high, melting may be excessive, resulting in low manufacturing accuracy. In order to form porous and no-porous bodies selectively and separately from each other while obtaining the manufacturing accuracy, any one or both of the scan speed and the scan pitch of the energy beam can be changed.

The scan speed is associated with the time required for forming a manufactured object. When the no-porous structure is formed by switching the scan speed, the scan speed is required to be reduced, which may reduce the manufacturing speed. Therefore, when the porous structure and the no-porous structure are formed selectively and separately from each other by switching the scan pitch without switching the scan speed, the manufacturing speed is not greatly influenced, and thus this manner can be particularly adopted.

In the case of the directional energy deposition, the no-porous structure and the porous structure can be formed selectively and separately from each other by changing the amount of heat to be applied. Specifically, similarly to the powder bed fusion method, if at least one of the output of the energy beam, the relative position between the manufacturing surface and the focus of the energy beam, the scan pitch, and the scan speed is changed according to the region, a desired condition can be derived.

In the manufacturing method of the present invention, the porous part, the frame body, and the stress relaxation part to be formed by the radiation of the energy beam are formed from the same powder, and thus have substantially the same composition.

The base plate material used in the present invention can be appropriately selected and used from materials such as metals and inorganic compounds used usually in manufacturing of manufactured objects in consideration of applications of the manufactured objects and manufacturing conditions of the manufactured objects.

The method of manufacturing an article including an inorganic compound according to the present invention is a method of obtaining a manufactured object in which no fracture occurs at a boundary portion between a porous part and a frame body even when a heat treatment described below is performed. Specifically, a step of irradiating a material powder with an energy beam to melt and solidify or sinter the material powder (manufacturing step) is performed to manufacture a manufactured object having a stress relaxation part which relaxes stress occurring at the boundary portion between the porous part and the frame body.

(Heat Treatment)

The manufactured object obtained in the manufacturing step can be heated after the manufacturing step. The heat treatment has an effect of reducing stress and microcracks generated in each part of the manufactured object in the manufacturing step. In order to reduce or eliminate microcracks, a more effective process is preferably a process of causing a molded object to absorb a liquid containing a main component of the molded object and a component capable of forming eutectic and then heating the molded object. When the main component of the manufactured object is aluminum oxide, it is preferable to heat the molded product after absorb liquid containing zirconium component (hereinafter referred to as a zirconium-component containing liquid). The strength of the manufactured object is dramatically enhanced by the reduction or elimination of the microcracks.

Here, the zirconium-component containing liquid will be described.

Zirconium-component containing liquid including a zirconium component raw material, an organic solvent, and a stabilizer can be used.

Various zirconium compounds can be used as the zirconium component raw material. When a manufactured object formed of alumina as a main component is caused to absorb zirconium-component liquid, a raw material containing no metal element other than zirconium can be used. Metal alkoxide of zirconium or a salt compound such as chloride or nitrate of zirconium can be used as the zirconium component raw material. Metal alkoxide is preferable among the above materials because the zirconium-component containing liquid can be caused to be uniformly absorbed in microcracks of the manufactured object. Specific examples of zirconium alkoxide include zirconium tetraethoxide, zirconium tetra n-propoxide, zirconium tetraisopropoxide, zirconium tetra n-butoxide, and zirconium tetra-t-butoxide.

First, zirconium alkoxide is dissolved in an organic solvent to prepare a zirconium alkoxide solution. The addition amount of the organic solvent to be added to zirconium alkoxide is preferably not less than 5 and not more than 30 in molar ratio with respect to the compound, more preferably not less than 10 and not more than 25. In the present invention, the expression "the addition amount of A is 5 in molar ratio with respect to B" means that the molar amount of A to be added is 5 times as large as the molar amount of B. When the concentration of zirconium alkoxide in the solution is too low, a sufficient amount of the zirconium component cannot be absorbed by the manufactured object. On the other hand, when the concentration of zirconium alkoxide in the solution is too high, zirconium component in the solution will agglomerate, and the zirconium component cannot be uniformly arranged in the microcrack portion of the manufactured object.

One of alcohols, carboxylic acids, aliphatic or alicyclic hydrocarbons, aromatic hydrocarbons, esters, ketones, ethers, and a mixed solvent of two or more of the above materials is used as the organic solvent. For example, methanol, ethanol, 2-propanol, butanol, 2-methoxyethanol, 2-ethoxyethanol, 1-methoxy-2-propanol, 1-ethoxy-2-propanol, 1-propoxy-2-propanol, 4-methyl-2-pentanol, 2-ethylbutanol, 3-methoxy-3-methylbutanol, ethylene glycol, diethylene glycol, glycerin and the like can be used as the alcohols. Further, n-hexane, n-octane, cyclohexane, cyclopentane, cyclooctane and the like can be used as the aliphatic or alicyclic hydrocarbons. Toluene, xylene, ethylbenzene and the like can be used as the aromatic hydrocarbons. Ethyl formate, ethyl acetate, n-butyl acetate, ethylene glycol monomethyl ether acetate, ethylene glycol monoethyl ether acetate, ethylene glycol monobutyl ether acetate, and the like can be used as the esters. Acetone, methyl ethyl ketone, methyl isobutyl ketone, cyclohexanone and the like can be used as the ketones. Dimethoxyethane, tetrahydrofuran, dioxane, diisopropyl ether and the like can be used as the ethers. When the zirconium-component containing liquid is used in the present invention, the alcohols are preferably used among the above-mentioned various solvents from the viewpoint of solution stability.

Next, the stabilizer will be described. Since zirconium alkoxide has high reactivity with water, zirconium alkoxide is rapidly hydrolyzed with water in the air or by adding water to cause cloudiness and precipitation of the solution. In order to prevent these events, a stabilizer can be added to stabilize the solution. Examples of the stabilizer can include β-diketone compounds such as acetylacetone, 3-methyl-2, 4-pentanedione, 3-ethyl-2,4-pentanedione, and trifluoroacetylacetone, β-ketoester compounds such as methyl acetoacetate, ethyl acetoacetate, butyl acetoacetate, allyl acetoacetate, benzyl acetoacetate, isopropyl acetoacetate, tert-butyl acetoacetate, isobutyl acetoacetate, ethyl 3-oxohexanoate, ethyl 2-methylacetoacetate, ethyl 2-fluoroacetoacetate, and 2-methoxyethyl acetoacetate, and alkanolamines such as monoethanolamine, diethanolamine and triethanolamine, etc. The addition amount of the stabilizer is preferably not less than 0.1 and not more than 3 in molar ratio with respect to zirconium alkoxide, more preferably not less than 0.5 and not more than 2.

A zirconium-component containing liquid including zirconium component particles, a dispersant, and a solvent can be used as another example.

Zirconium particles or zirconia particles which are oxides of zirconium can be used as the zirconium-component particles. The zirconium particles or the zirconia particles may be produced by crushing respective materials thereof according to a top-down method, or may be synthesized from metal salts, hydrates, hydroxides, carbonates or the like by a method such as hydrothermal reaction using a bottom-up method, or a commercially available product may be used.

The size of the particles is preferably 300 nm or less, more preferably 50 nm or less to cause the particles to penetrate into microcracks.

The shape of the particles is not particularly limited, and may be spherical, granular, columnar, elliptical, cubic, rectangular, needle-like, columnar, plate-like, scale-like, or pyramidal.

Examples of the dispersant can include at least one of an organic acid, a silane coupling agent, and a surfactant. Examples of the organic acid can include acrylic acid, 2-hydroxyethyl acrylate, 2-acryloxyethyl succinic acid, 2-acryloxyethyl hexahydrophthalic acid, 2-acryloxyethyl phthalic acid, 2-methylhexanoic acid, 2-ethylhexanoic acid, 3-methylhexanoic acid, 3-ethylhexanoic acid and the like. Examples of the silane coupling agent can include 3-acryloxypropyltrimethoxysilane, 3-methacryloxypropyltrimethoxysilane, hexyltrimethoxysilane, octyltriethoxysilane, decyltrimethoxysilane and the like. Examples of the surfactant can include ionic surfactants such as sodium oleate, fatty acid potassium, sodium alkylphosphate, alkylmethylammonium chloride, and alkylaminocarboxylate, and nonionic surfactants such as polyoxyethylene laurate fatty acid ester, and polyoxyethylene alkylphenyl ether.

Alcohols, ketones, esters, ethers, ester-modified ethers, hydrocarbons, halogenated hydrocarbons, amides, water, oils, or a mixed solvent of two or more of the above materials are used as the solvent. Examples of the alcohols can include methanol, ethanol, 2-propanol, isopropanol, 1-butanol, ethylene glycol and the like. Examples of the ketones can include acetone, methyl ethyl ketone, methyl isobutyl ketone, cyclohexanone and the like. Examples of the esters can include ethyl acetate, propyl acetate, butyl acetate, 4-butyrolactone, propylene glycol monomethyl ether acetate, methyl 3-methoxypropionate and the like. Examples of ethers can include ethylene glycol monomethyl ether, diethylene glycol monobutyl ether, butyl carbitol, 2-ethoxyethanol, 1-methoxy-2-propanol, 2-butoxyethanol and the like. For example, propylene glycol monomethyl ether acetate can be used as a modified ether. Examples of the hydrocarbons can include benzene, toluene, xylene, ethylbenzene, trimethylbenzene, hexane, cyclohexane, methylcyclohexane and the like. Examples of the halogenated hydrocarbons can include dichloromethane, dichloroethane, and chloroform. Examples of the amides can include dimethylformamide, N,N-dimethylacetamide and N-methylpyrrolidone. Examples of the oils can include mineral oil, vegetable oil, wax oil, and silicone oil.

The zirconium-component containing liquid may be formed by simultaneously mixing the zirconium particles or the zirconia particles, the dispersant, and the solvent, or may be formed by mixing the zirconium particles or the zirconia particles and the dispersant and then mixing the resultant mixture with the solvent. Alternatively, the zirconium-component containing liquid may be formed by mixing zirconium or zirconia microparticles and the solvent and then mixing the resultant mixture with the dispersant, or may be formed by mixing the dispersant and the solvent and then mixing the resultant mixture with the zirconium or zirconia microparticles.

The above-mentioned solution may be prepared by reaction at room temperature or refluxing.

In the manufacturing step of irradiating the powder layer with an energy beam to melt and solidify or sinter the powder, many microcracks occur in the manufactured object when the manufactured object is cooled and solidified because the temperature difference between the irradiated part and the surrounding area thereof is large.

The zirconium-component containing liquid infiltrates not only the surface layer of the manufactured object, but also the inside of the manufactured object through microcracks and is distributed. A method of causing the manufactured object to absorb the zirconium-component containing liquid as long as a sufficient amount of the zirconia component can be interposed in a sufficient range of the microcracks of the manufactured object. The manufactured object may be immersed in and impregnated with the zirconium-component containing liquid, or the zirconium-component containing liquid may be atomized and sprayed onto the manufactured object, droplets of zirconium component-containing liquid may be dropped onto the shaped object, or may be coated by a brush or the like. Further, a plurality of these methods may be combined, or the same method may be repeated a plurality of times.

Next, a step of heating the manufactured object having the zirconium-component containing liquid absorbed therein will be described. When the manufactured object is caused to absorb the zirconium-component containing liquid in the above step of absorbing the zirconium-component containing liquid (hereinafter referred to as the absorption step), a certain amount of the zirconium component exists on the surface of the manufactured object facing microcracks. When the heat treatment is performed in this state, in the vicinity of a region where the zirconium component exists on the surface, an alumina component whose amount brings a eutectic composition or a composition ratio close to the eutectic composition together with the amount of the zirconium component is considered to be melt at a temperature lower than the melting point of the manufactured object and then recrystallized, which contributes to repair of the microcracks. As a result, it is considered that only regions near microcracks are softened while the shape of the manufactured object is maintained, and an effect of reducing or eliminating the microcracks is obtained.

At this time, it is considered that the zirconium component not only stays on only the surfaces of the microcracks, but also performs solid phase diffusion into the manufactured object. As the temperature decreases after heating is finished, the zirconium component and the components contained in the manufactured object are mixed and recrystallized in the vicinity of the microcracks after melting. Therefore, it is considered that portions where cracks have been repaired have stronger bonding among tissues as compared with a method of filling the cracks with glass by glass infiltration or the like, so that a manufactured object having high mechanical strength is obtained.

When aluminum oxide is contained in the manufactured object, portions where the zirconium component of the manufactured object exists, that is, portions near microcracks partially melt by heating the manufactured object at a maximum temperature of not less than 1600° C. and not more than 1710° C. The maximum temperature at which the molded object is heated is more preferably from 1650° C. to 1710° C. When the temperature of the microcrack portion reaches a maximum temperature of 1600° C. to 1710° C., the microcrack portion where the zirconium component exists melts. Therefore, the heating time is not particularly limited. Further, by controlling the heating temperature, only the vicinity of the portion where the zirconium component exists can be melted, so that the shape of the manufactured object does not collapse, and the advantage of the direct manufacturing method is secured. Therefore, the shape of the manufactured object is maintained even when heating is performed for a long time. After melting, the solidified and recrystallized manufactured object has significantly enhanced mechanical strength due to reduction or elimination of microcracks. The heating method is not particularly limited, but a method of heating the manufactured object while the manufactured object is placed in a furnace is simple. The components of the metal elements contained in the liquid to be absorbed by the manufactured object obtained in the molding step and the heating temperature are not limited to the above examples. The components of the metal elements to be absorbed in the liquid and the heating temperature can be changed according to the composition of the powder used for molding.

(Article Including Inorganic Compound)

An article including an inorganic compound of the present invention includes a porous part having a porous structure, a frame body having a no-porous structure and surrounding the porous part, and a stress relaxation part between the porous part and the frame body, the porous part and the frame boding being arranged in an in-plane direction.

In the present invention, the stress relaxation part has a function of relaxing stress occurring at the boundary between the porous part and the frame body. By providing the stress relaxation part, cracks and deformation caused by the stress can be suppressed, and an article including an inorganic compound in which the porous part and the frame body are integrated with each other can be formed. Such a structure is particularly suitable for a case where a structure including an inorganic compound in which a porous structure and a no-porous structure are integrated with each other is formed by the additive manufacturing method based on the direct molding method such as the powder bed fusion method.

A manufactured object including an inorganic compound formed by the additive manufacturing of the direct molding method has many microcracks therein. Therefore, in order to obtain higher strength, the manufactured object can be subjected to the heat treatment after the additive manufacturing. A part of the manufactured object including the inorganic compound is melted and sintered by the heat treatment, and the microcracks are reduced, thereby enhancing the mechanical strength of the manufactured object. In particular, by performing the above-described absorption treatment step and heat treatment step on the manufactured object, microcracks in the manufactured object are greatly reduced, and the mechanical strength is further enhanced.

In the case of the manufactured object in which the porous structure and the no-porous structure are integrated with each other, a large stress occurs at the boundary between a part having the porous structure and a part having no-porous structure under the heat treatment because the part having the porous structure and the part having the no-porous structure are different from each other in thermophysical property. In the article including the inorganic compound of the present invention, the stress relaxation part provided around the no-porous part is deformed according to contraction or expansion of each part under the heat treatment of the manufactured object, thereby relaxing the stress occurring at the boundary between the porous part and the frame body, which can prevent breakage of the porous part and the boundary between the porous part and the frame body at which the mechanical strength is relatively low. Therefore, a high-strength article including an inorganic compound in which the porous part and the frame body are integrated with each other.

Figure 3A:
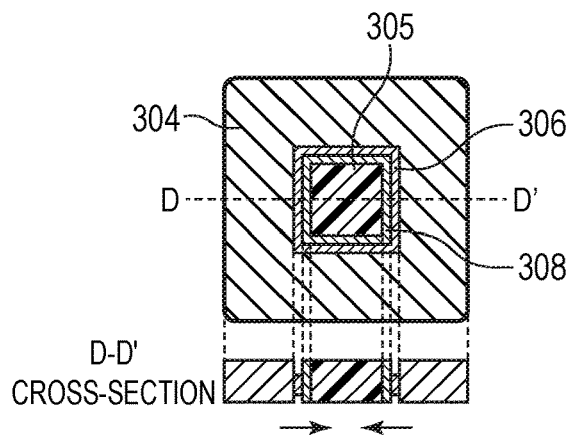
FIG. 3A is a top view and a cross-sectional view schematically illustrating an embodiment example of an article of the present invention.

The stress relaxation part can be flexibly deformed according to deformation of the porous part and the frame body under the heat treatment. FIGS. 3A to 3F are top and cross-sectional views illustrating examples of an embodiment of the article of the present invention. FIG. 3A illustrates a plate-shaped article including an inorganic compound that has a porous part 305 and a frame body 304 surrounding the porous part 305 in the in-plane direction, and also has a stress relaxation part 306 around the porous part 305 in the in-plane direction. In FIGS. 3A to 3F, the article includes a support part 308 which has a no-porous structure and covers the periphery (side surface) of the no-porous part between the porous part and the stress relaxation part. As a result, the strength of the side surface of the porous part 305 can be enhanced. The thickness of the support part 308 in the in-plane direction is preferably 5 mm or less, more preferably 3 mm or less. The stress relaxation part 306 is provided at a location adjacent to the support part 308.

Figure 3D:
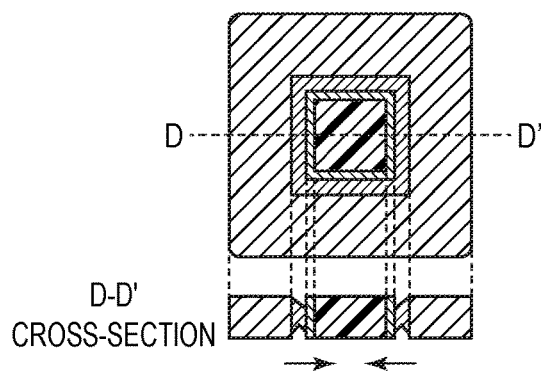
FIG. 3D is a top view and a cross-sectional view schematically illustrating an embodiment example of the article of the present invention.

As the article according to the present invention, the stress relaxation part 306 can have a no-porous structure which is formed to have a thickness smaller than the thickness of the porous part in a direction perpendicular to the in-plane direction and surround the porous part 305. The stress relaxation part 306 is provided in a region within 10 mm from the end portion of the porous part 305. In FIGS. 3A, 3C, and 3D, the average thickness of the stress relaxation part 306 is smaller than the average thickness of the porous part 305 as illustrated in D-D' cross-sections. It is more preferable that the stress relaxation part 306 not only is thinner than the no-porous part, but also has an oblique shape or a bellowslike shape as illustrated in FIGS. 3C and 3D. When the stress relaxation part 306 has an oblique shape or a bellowslike shape, the stress relaxation part 306 can more easily follow the thermal deformation of the porous part 305 and the frame body 304. As a result, the thinned stress relaxation part 306 can deform according to the thermal contraction or thermal expansion of the porous part 305, and relax the stress. Here, the average thickness of each of the stress relaxation part 306 and the porous part 305 indicates an average thickness in the thickness direction of the plate-shaped article.

As illustrated in FIGS. 3A, 3C, and 3D, in the case of a plate-shaped article having a structure including a porous body and a no-porous body surrounding the porous body in the in-plane direction, the average thickness of the stress relaxation part can be set to be smaller than the average thickness of the no-porous part. From the viewpoint of enhancing stress relaxing performance, the average thickness of the thin part is preferably 70% or less, more preferably 60% or less of the average thickness of the no-porous part although depending on the porosity of each part. On the other hand, in order to obtain a sufficient strength of the manufactured object, the average thickness of the stress relaxation part can be set to 20% or more of the average thickness of the frame body.

Figure 3B:
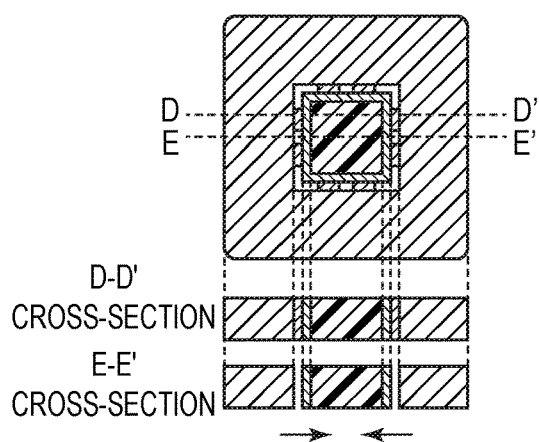
FIG. 3B is a top view and a cross-sectional view schematically illustrating an embodiment example of the article of the present invention.
Figure 3E:
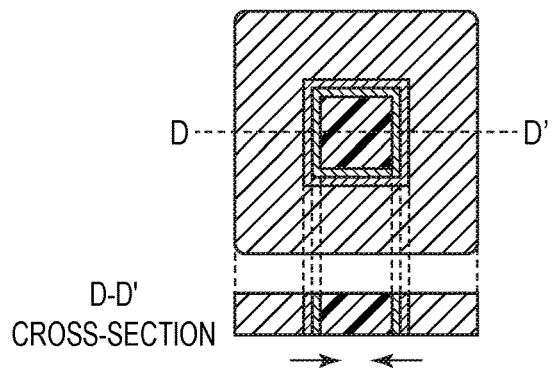
FIG. 3E is a top view and a cross-sectional view schematically illustrating an embodiment example of the article of the present invention.
Figure 3C:
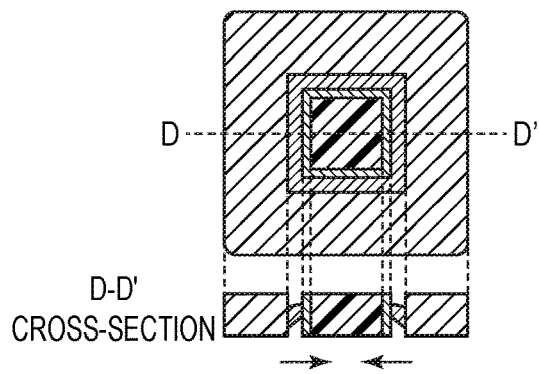
FIG. 3C is a top view and a cross-sectional view schematically illustrating an embodiment example of the article of the present invention.
Figure 3F:
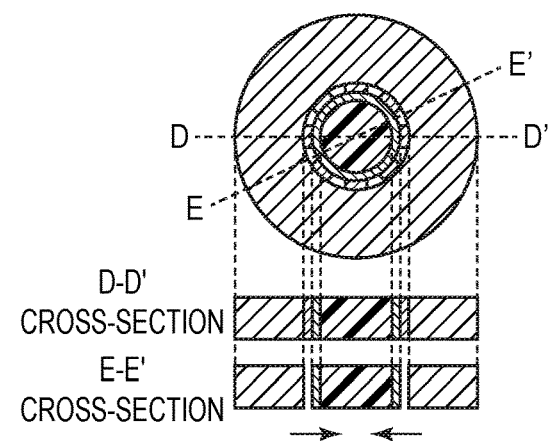
FIG. 3F is a top view and a cross-sectional view schematically illustrating an embodiment example of the article of the present invention.

The stress relaxation part 306 may be divided into a plurality of discontinuous parts which are spaced from one another as illustrated in FIGS. 3B and 3F. E-E' cross-sections of FIGS. 3B and 3F illustrate cross-sections passing through portions where no parts are provided. In FIGS. 3B and 3F, the thickness of each part constituting the stress relaxation part 306 (the thickness in the in-plane direction, which corresponds to the width of each part in top view) is smaller than the average thickness of the no-porous part 305 (the thickness in the plate thickness direction). In the case of such a structure, each part of the stress relaxation part can be deformed according to the thermal contraction or thermal expansion of the porous part 305, and can relax the stress. Although the plurality of parts can relax the stress without being thinned in the plate thickness direction, the stress relaxation effect can be made higher by thinning the plurality of parts in the plate thickness direction. As illustrated in FIGS. 3B and 3F, when the stress relaxation part is divided into a plurality of discontinuous parts, a value obtained by summing the widths of the parts of the stress relaxation part is preferably 70% or less, more preferably 60% or less of the circumferential length of the porous part. Further, in order to obtain a sufficient strength of the manufactured object, the value obtained by summing the widths of the parts of the stress relaxation part can be set to 20% or more of the circumferential length of the porous part. Here, the width of each part of the stress relaxation part indicates the average length of each part in the circumferential direction of the porous part in plan views of FIGS. 3A to 3F.

When molding is performed by the additive manufacturing apparatus using the powder bed fusion method or the like, stable molding can be performed if the overhang part is inclined at 45° or less with respect to the molding direction (the layering direction of the powder layer). Therefore, the stress relaxation part 306 can be designed so as to be inclined at 45° or less with respect to the molding surface during molding.

Further, as illustrated in FIG. 3E, the stress relaxation part 306 can be formed to have a structure having a porosity C which is larger than a porosity A of the porous part 305 and smaller than a porosity B of the frame body 304. The stress relaxation part 306 having such a configuration also shows the thermophysical properties between the porous part and the frame body under the heat treatment to be capable of dispersing the stress, and can provide an article including an inorganic compound in which the porous structure and the no-porous structure are integrated with each other.

The density of the stress relaxation part can be set to be larger than the density of the porous part and smaller than the density of the frame body. However, the stress relaxation part most preferably has a porosity which is as low as the frame body. In other words, when the average porosity of the stress relaxation part is represented by A and the average porosity of the frame body is represented by B, the ratio A/B is preferably not less than 0.9 and not more than 1.1, more preferably not less than 0.95 and not more than 1.05. When the stress relaxation part has a porosity which is as low as the frame body, it is possible to suppress variation in the flow rate of fluid flowing out of or into the article through the porous part. In addition, a sufficiently high strength that can withstand practical use can be obtained.

The porous part, the frame body, and the stress relaxation part can be formed of substantially the same material. When the support part is provided around the porous part, the support part can be formed of substantially the same material as the other parts. Specifically, a first metal element contained most in the molar ratio and a second metal element contained next most in the molar ratio can be made common among the porous part, the frame body, the stress relaxation part and the support part. This facilitates temperature control in the heating step for increasing the strength of the manufactured object, and also enables smooth surface processing with less unevenness when the manufactured object is processed by polishing processing or the like.

The first metal element can be aluminum and the second metal element can be a rare earth element. The oxide containing aluminum and the rare earth forms a phase separation structure including two or more phases. The phase separation structure can have an effect of suppressing extension of cracks and additionally exert a function of enhancing mechanical strength of the manufactured object, etc.

Figure 4A:
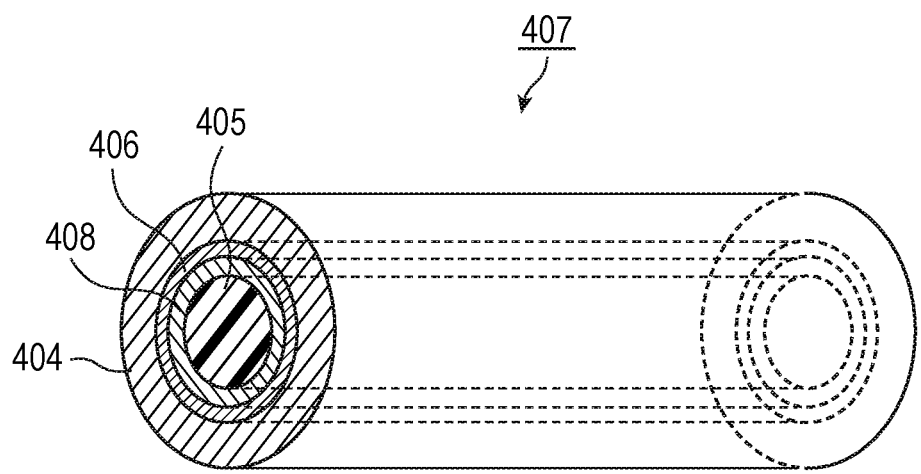
FIG. 4A is a cross-sectional view of an article according to an example of another embodiment of the present invention.
Figure 4B:
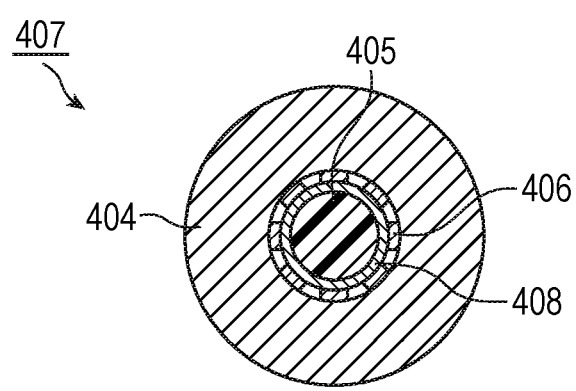
FIG. 4B is a cross-sectional view of an article according to an example of another embodiment of the present invention.

FIGS. 4A and 4B illustrates a tubular article according to an example of another embodiment of the present invention. FIG. 4A is a perspective view of an article 407 that is long in one direction, and FIG. 4B is a cross-sectional view when the article 407 is cut in a direction perpendicular to a longitudinal direction. In an in-plane direction illustrated in FIG. 4B, the article 407 includes a porous part 405 having a porous structure and a frame body 404 which has a no-porous structure and surrounds the porous part 405, and also includes a stress relaxation part 406 provided so as to surround the frame body 404. As in FIG. 3A, the side surface of the porous part 405 is thinly covered with a support part 408 of the same degree of denseness (porosity) as the frame body 404 to keep strength. The thickness of the support part 408 is preferably 5 mm or less, more preferably 3 mm or less.

The stress relaxation part 406 of FIG. 4A and FIG. 4B includes a plurality of discontinuous parts, and has a structure in which the article including the plate-like inorganic compound illustrated in FIG. 3F is elongated in the plate thickness direction. The stress relaxation part 406 is not limited to the examples illustrated in FIGS. 4A and 4B. The stress relaxation part 406 may include a plurality of parts that are continuous in the cross-sectional direction, but discontinuous in the length direction, or the stress relaxation part 406 may have a structure having a porosity C which is larger than the porosity A of the porous part 405 and smaller than the porosity B of the frame body 404.

In the case of the structure illustrated in FIGS. 4A and 4B, a value obtained by summing the respective circumferential widths of the parts of the stress relaxation part 406 is preferably 70% or less, more preferably 60% or less of the circumferential length of the porous part 405.

Also, when the stress relaxation part 406 includes a plurality of parts that are continuous in the circumferential direction and are discontinuous in the longitudinal direction, a value obtained by summing the respective plate thicknesses (widths in the longitudinal direction) of the parts is preferably 70% or less, more preferably 60% or less of the length of the article in the longitudinal direction. In order to obtain sufficient strength of the article, a value obtained by summing the plate thicknesses of the porous parts 405 can be set to 20% or more of the length of the article in the longitudinal direction. Here, the plate thickness of each part of the stress relaxation part 406 indicates the average length of each part in the longitudinal direction.

The article including the inorganic compound of the present invention is suitable for a chuck plate used for transporting or fixing an object. The inorganic compounds have higher thermal resistance than metals. In addition, the thinned stress relaxation part has a large thermal resistance because the cross-sectional area in the thickness direction of the plate is small. Therefore, the article including the inorganic compound of the present invention is used as the chuck plate to obtain an effect of suppressing heat transfer to the porous part (chucking part). For example, when the article is used as a plate on which a chip is mounted in a die bonder apparatus for mounting a semiconductor, deterioration caused by heat of a mounting adhesive tape attached to a chip can be suppressed.

EXAMPLES

The article including the inorganic compound and the method of manufacturing the article including the inorganic material according to the present invention will be described below in detail with reference to the following examples, but the present invention is not limited to the following examples.

Example 1

The present example is an example in which a plate-shaped article including a frame body having a no-porous structure, a stress relaxation part having a reduced thickness, and a porous part having a lattice-like pattern is manufactured under a melting/solidification condition and used as a chuck plate.

First, a design drawing of a manufactured object including a porous part, a frame body having a no-porous structure and a stress relaxation part having a reduced thickness was created by using 3D CAD software. FIG. 3D illustrates a schematic shape of the target manufactured object. The manufactured object is a square plate of 4 cm square and 8 mm thick. An outer peripheral portion of the plate has a no-porous structure, and a porous part having a porous structure which has a square shape of 1 cm square and intercommunicates in the thickness direction of the plate is provided at the center of the manufactured object. The corners of the square are rounded to have a radius of 2 mm. As illustrated in FIG. 3D, the manufactured object has a bellowslike stress relaxation part having a no-porous structure which is thinned in the plate thickness direction. The average thickness of the stress relaxation part is 3 mm, which is 38% of the average thickness of the porous part.

From the 3D CAD design drawing, slice data for a thickness of 20 μm in the thickness direction of the plate was created, and the slice data was taken into the additive manufacturing apparatus.

Next, α-$Al_2O_3$ powder, $Gd_2O_3$ powder, and $Tb_2O_{3.5}$ powder ($Tb_4O_7$ powder) were prepared, and the respective powder components were weighed so that the molar ratio was equal to $Al_2O_3:Gd_2O_3:Tb_2O_{3.5}=77.4:20.8:1.8$. The respective weighed powder components were mixed in a dry ball mill for 30 minutes to obtain mixed powder (material powder).

The manufactured object of Example 1 was formed based on the slice data through basically the same steps as those illustrated in FIGS. 2A to 2G described above.

ProX DMP 100 (trade name) of 3D SYSTEMS, Inc. equipped with a 50 W Yb fiber laser (beam diameter 65 μm) was used for formation of the manufactured object.

First, a first powder layer having a thickness of 20 μm and including the above material powder was formed on a base formed of pure alumina by using a roller. The powder layer was irradiated with a 30 W laser beam at a scan speed of 140 mm/s and a scan pitch of 100 μm as if the powder layer was filled with the laser beam, whereby the material powder in a region where a no-porous structure was to be formed was melted and solidified to be hardened based on slice data of the first layer. Next, the above powder layer was irradiated with the above 30 W laser beam at a scan speed of 180 mm/s and a scan pitch of 175 μm, whereby the material powder in a region where a porous structure was to be formed was hardened based on the slice data of the first layer. A drawing line was set to be inclined at 45° to the square.

Next, a powder layer having a 20 μm thickness was newly formed with a roller so as to cover the above powder layer. After the powder in a region where a no-porous structure was to be formed was melted and solidified in a direction perpendicular to the drawing line of the first layer based on slice data of a second layer, the powder in a region where a porous structure was to be formed was hardened. Such a step was repeated based on slice data of each layer to form the manufactured object of Example 1. The thickness of the manufactured object was set to a thickness (10 mm) of a design value +2 mm for a margin for separating the manufactured object from the base. The obtained manufactured object was cut off from the base and unbonded powder was removed to obtain a manufactured object (8 mm thickness) in which the part having the porous structure and the part having the no-porous structure were integrated with each other.

Next, the manufactured object was impregnated with the zirconium-component containing liquid. The zirconium-component containing liquid was prepared as follows. A solution was prepared by dissolving 85% by weight of zirconium (IV) butoxide (hereinafter, referred to as Zr(O-n-Bu)$_4$) in 1-butanol. The solution of Zr(O-n-Bu)$_4$ was dissolved in 2-propanol (IPA), and ethyl acetoacetate (EAcAc) was added as a stabilizer. The molar ratio of the respective components was set to Zr(O-n-Bu)$_4$:IPA:EAcAc=1:15:2. Thereafter, the mixture was stirred at room temperature for about 3 hours to prepare the zirconium-component containing liquid. The weight concentration of a zirconia solid content of this liquid is 8%.

The manufactured object was immersed in the zirconium-component containing liquid, degassed under reduced pressure for 1 minute to cause the liquid to infiltrate into the manufactured object, and then naturally dried for 1 hour.

The manufactured object impregnated with the zirconium-component containing liquid as described above was placed and heated in an electric furnace. Specifically, the temperature was raised in the air atmosphere for 2.5 hours so that the sample temperature was equal to 1670° C., and the sample temperature was kept at 1670° C. for 50 minutes, and then cooled to 200° C. or less in 5 hours.

Figure 7:
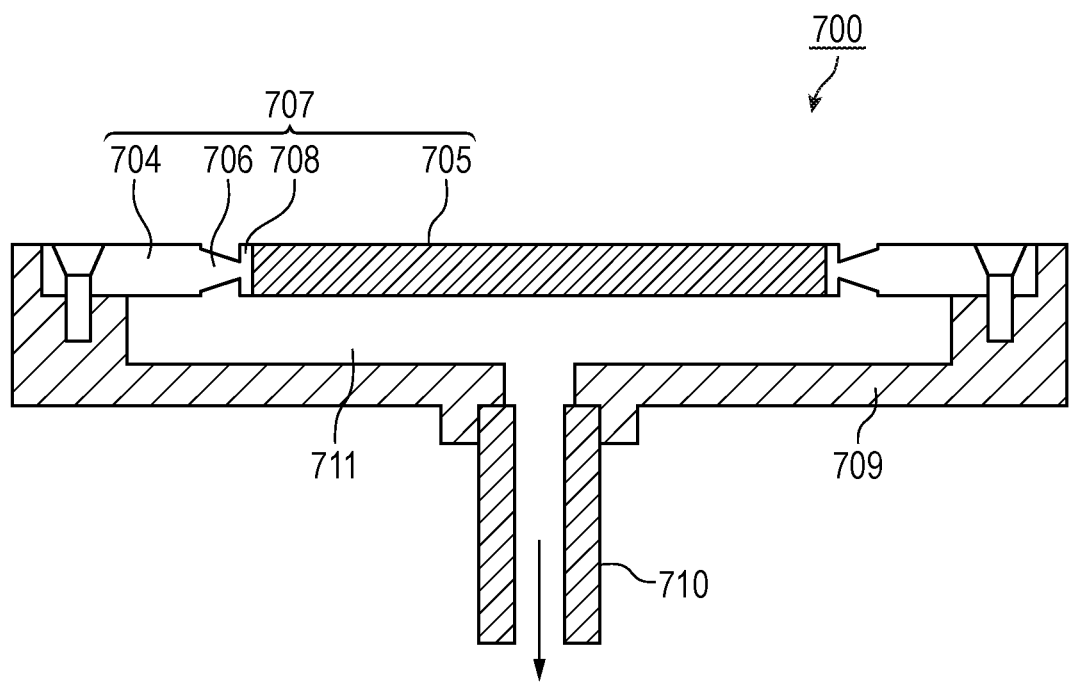
FIG. 7 is a schematic configuration diagram illustrating a cross-section of a chuck table produced in an example.

In Example 1, the step of impregnating the manufactured object with the zirconium-component containing liquid and the heating step were alternately repeated three times respectively to obtain an article 707 including an inorganic compound illustrated in FIG. 7. The article 707 is a plate-shaped article in which a porous part 705 whose side surface is covered with a support part 708 and a no-porous part 704 are connected to and integrated with each other via a stress relaxation part 706 in an in-plane direction.

The porous part 705 of the manufactured article 707 had open pores intercommunicating from one surface to the opposite surface. The manufactured article 707 was screwed to a body part 709 having a concave part 711 to which a vent 710 was connected so that the manufactured article 707 covered the concave part 711, thereby producing a chuck table 700. When Si wafer was placed on the article (chuck plate) 707 and the air inside the body part 709 was exhausted from the vent 710 by using a pump or the like, the concave part 711 fell into a reduced pressure state, and thus the Si wafer could be chucked. When air was introduced from the vent 710 to remove the Si wafer which had been chucked, the pressure in the concave part 711 increased, so that the Si wafer could be easily removed from the chuck plate.

The surface of the obtained article was polished and the porosity was calculated from an image obtained by SEM observation, which indicated that the porosity of the porous part was 31% and the porosities of the frame body and the stress relaxation part were 2%.

In order to confirm the strength of the article, a similar article was prepared and a drop test was performed. The articles were caused to freely fall onto Lauan wood from heights of 30 cm, 60 cm and 100 cm so that side corners of the plate-shaped articles landed first of all, but no damage was found on the article.

Example 2

The present example is an example in which heating was performed only once without performing zirconium impregnation after molding. An article including an inorganic compound was produced under the same condition as Example 1 except that the zirconium impregnation step was eliminated and heating was performed once.

Example 3

This example is an example in which the arrangement of open pores in the porous part is random.

An article including an inorganic compound was produced under the same condition as Example 1 except that the drawing speed was 220 mm/s and the drawing pitch was 125 µm in order to obtain a porous part having randomly arranged open pores.

Example 4

The present example is an example in which an article having a shape different from that of Example 1 was produced.

FIG. 3F illustrates a schematic shape of a target article. The article is a disc having a diameter of 4 cm and a thickness of 15 mm. The disc has an outer peripheral portion which includes a no-porous part, and also includes, at the center thereof, a porous part which has a circular shape having a diameter of 1 cm and intercommunicates through the disc in the thickness direction of the disc. Furthermore, a stress relaxation part which is shaped to be thinned in the in-plane direction of a plate as illustrated in FIG. 3F exists between the no-porous part and the porous part so as to be radially divided into eight parts at regular intervals. The average width (16 mm) of the stress relaxation part obtained by summing the average widths (2 mm) of the respective parts of the stress relaxation part is about 51% of the circumferential length 7C of the circular porous part. An article including an inorganic compound was produced under the same condition as Example 1 except for the shape.

Example 5

The present example is an example in which an article including a stress relaxation part having a shape different from that of Example 1 was produced. FIG. 3A illustrates a schematic shape of a target article. As illustrated in FIG. 3A, a manufactured object of the present example includes a stress relaxation part which is shaped to be thinned in parallel to the thickness direction of the plate. The stress relaxation part has a uniform thickness of 5.6 mm, which is 70% of the thickness 8 mm of the porous part. In the present example, a supporter which was formed under the same condition as the porous part was provided at a lower portion of the stress relaxation part which was an overhang portion intersecting at 90° to the molding direction (the layering direction of the powder layer). The step of melting/solidifying or sintering material powder by radiating an energy beam as in the case of Example 1 was repeated to form a manufactured object having a supporter attached thereto. After the supporter was removed from the manufactured object, the manufactured object was separated from the base and unbonded powder was washed away, thereby producing an article including an inorganic compound of Example 5 through the same manufacturing method as Example 1.

Example 6

The present example is an example in which an article including a stress relaxation part having an average width different from that of Example 4 was produced.

The article is a disc having a diameter of 4 cm and a thickness of 15 mm. The article includes a frame body (the outer peripheral portion of the disc) having a no-porous structure, and also includes, at the center thereof, a porous part having a circular porous structure which has a diameter of 1 cm and intercommunicates in the thickness direction of the disc. The article further includes a stress relaxation part which is shaped to be thinned in the in-plane direction of the plate and radially divided into ten parts at regular intervals. The average width (9 mm) of the stress relaxation part obtained by summing the average widths (0.9 mm) of the respective parts of the stress relaxation part is about 29% of the circumferential length 7C of the circular porous part. An article including an inorganic compound was produced under the same condition as Example 4 except for the average width of the stress relaxation part and the number of parts.

Comparative Example 1 and Comparative Example 2

An article for comparison having no stress relaxation part between the porous part and the frame body was produced. The target article for comparison is a square plate of 4 cm square and 8 mm thickness, and includes a frame body (the outer peripheral portion of the plate) having a no-porous structure, and also includes, at the center thereof, a porous part having a porous structure which has a square shape of 1 cm square and intercommunicates in the thickness direction of the plate. No stress relaxation part is provided between the porous part and the frame body.

With respect to a comparative article of Comparative Example 1, the heating step was performed only once without performing the step of impregnating a manufactured object with the zirconium-component containing liquid. With respect to an article of Comparative Example 2, a manufactured object produced under the same condition as Example 1 was impregnated with the zirconium-component containing liquid, and then the heating step was performed once. Under both the conditions, cracks appeared at the boundary between the porous part and the frame body of the article during the heating step.

Table 1 illustrates evaluation results of the Examples and Comparative Examples in a lump. Note that in a drop test result of the table, "OK" indicates a case where no damage was observed in the article, and "NG" indicates a case where some damage was observed at least in part. For disc-shaped articles, the articles were also dropped so that the sides thereof landed first of all.

The function as the chuck plate was also checked for articles including inorganic compounds of Examples 2 to 6. Chuck plates including inorganic compounds of Example 2 to Example 6 were fixed in turn so as to cover the concave part 711 of the body part, thereby producing the chuck table illustrated in FIG. 7, and the function as the chuck table was checked in the same manner as the Example 1. The articles including the inorganic compounds of Examples 1 to 6 had open pores intercommunicating from one surface to the opposite surface, and all the manufactured objects were able to chuck Si wafer by suction.

The manufactured objects for comparison of Comparative Example 1 and Comparative Example 2 could not chuck Si wafer due to the influence of cracks generated in the heating step.

Comparing the examples in the case of the same shape, such a manufactured object having a bellowslike stress relaxation part as Examples 1 and 3 has a greater stress relaxation effect, and had more excellent drop test results as compared with the flat shape of Example 5. It is considered that Example 5 had some residual stress.

As compared with Example 6, Examples 1, 3 and 4 had higher strength and more excellent drop test results because the stress relaxation part had a moderate average plate thickness as compared with the average plate thickness of the porous part.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-042824, filed Mar. 8, 2019, and Japanese Patent Application No. 2020-023498, filed Feb. 14, 2020, which are hereby incorporated by reference herein in their entirety.

What is claimed is:

1. An article comprising:
   a first part having a porous structure;
   a frame body having a density larger than that of the first part and surrounding the first part in a plane where the first part and the frame body are arranged; and
   a second part between the first part and the frame body,

TABLE 1

| | Thickness (%) of stress relaxation part to porous part | Thinning direction of stress relaxation part | Shape of stress relaxation part | Impregnation | Heating | Porosity (%) | | | Drop test | | |
|---|---|---|---|---|---|---|---|---|---|---|---|
| | | | | | | Porous part | Stress relaxation part | No-porous part | 30 cm | 60 cm | 100 cm |
| Example 1 | 38 | Thickness direction | Bellowslike shape | Three times | Three times | 31 | 2 | 2 | OK | OK | OK |
| Example 2 | 38 | Thickness direction | Bellowslike shape | No | Once | 39 | 6 | 6 | OK | NG | — |
| Example 3 | 38 | Thickness direction | Bellowslike shape | Three times | Three times | 22 | 2 | 2 | OK | OK | OK |
| Example 4 | 51 | In-plane direction | Plate-like shape 3 | Three times | Three times | 30 | 2 | 2 | OK | OK | OK |
| Example 5 | 70 | Thickness direction | Plate-like shape 3 | Three times | Three times | 36 | 4 | 2 | OK | OK | NG |
| Example 6 | 29 | In-plane direction | Plate-like shape 3 | Three times | Three times | 28 | 4 | 3 | OK | OK | NG |
| Comparative example 1 | No stress relaxation part | | | No | Once | No evaluation because crack occurred in heating step | | | | | |
| Comparative example 2 | No stress relaxation part | | | Once | Once | No evaluation because crack occurred in heating step | | | | | |

(Consideration)

The manufactured objects of Examples 1 to 6 enabled formation of an article including an inorganic compound in which a porous part and a frame body were integrated with each other even after the heating step. On the other hand, the comparative examples each having no stress relaxation part could not obtain any article in which a porous part and a frame body were integrated with each other because cracks occurred at the boundary between the porous part and the frame body in the heating step.

Examples 1 and 3 to 6 on which the impregnation and heating steps were performed had high strength, and could withstand the drop test of 60 cm.

wherein each of the first part, the frame body, and the second part includes a common inorganic compound, and wherein the second part has at least one of a first structure, a second structure, or a third structure, wherein in the first structure, an average thickness of the second part in a direction perpendicular to the plane that is smaller than an average thickness of the first part in the direction perpendicular to the plane, wherein in the second structure, the second part includes a plurality of portions including the common inorganic compound, the plurality of portions are separated from each other, and each of plurality of portions connects the first part and the frame body, and wherein in the third structure, a porosity of the second part is larger than a porosity of the first part and smaller than a porosity of the frame body.

2. The article according to claim 1, further comprising a third part between the first part and the second part so as to surround the first part, wherein the third part includes the common inorganic compound.

3. The article according to claim 2, wherein a thickness of the third part in an in-plane direction of the plane is 5 mm or less.

4. The article according to claim 1, wherein the second part is provided within a range of 10 mm or less from an end portion of the first part.

5. The article according to claim 1, wherein a porosity per unit area on a cross-section of the first part is 15% or more, and a porosity per unit area on a cross-section of the frame body is 10% or less.

6. The article according to claim 1, wherein each of the first part, the frame body, and the second part includes at least one of aluminum oxide or zirconium oxide.

7. The article according to claim 6, wherein a ratio AB of a porosity A of the second part to a porosity B of the frame body is 0.9 to 1.1.

8. The article according to claim 1, wherein each of the first part, the frame body, and the second part contains a first metal element, and each of the first part, the frame body, and the second part contains a second metal element different from the first metal element.

9. The article according to claim 8, wherein the first metal element is aluminum and the second metal element is a rare earth element.

10. The article according to claim 1, wherein the article is plate-shaped.

11. A chuck table comprising:
a body part having a concave part to which a vent is connected; and
a chuck plate for blocking the concave part,
wherein the chuck plate is the article according to claim 1.

12. The article according to claim 1, wherein a weight content of a metal or a resin contained in the first part is not more than 1/10 of a weight of the common inorganic compound in the first part.

13. The article according to claim 1, wherein the inorganic compound is at least one selected from the group consisting of oxides, nitrides, fluorides, borides, chlorides, and sulfides.

14. The article according to claim 13, wherein the frame body contains a phase separation structure consisting of 2 or more phases.

15. The article according to claim 1, wherein the first part and the frame body are integrated with each other via the second part.

16. The article according to claim 1, wherein the second part has the first structure.

17. The article according to claim 1, wherein the second part has the second structure.

18. The article according to claim 1, wherein the second part has the third structure.

* * * * *